United States Patent
Kim et al.

(10) Patent No.: US 12,069,824 B2
(45) Date of Patent: Aug. 20, 2024

(54) DISPLAY APPARATUS

(71) Applicant: SAMSUNG ELECTRONICS CO., LTD., Suwon-si (KR)

(72) Inventors: Ki Hun Kim, Suwon-si (KR); Kyoung Hwan Kim, Suwon-si (KR); Seong Soo Kim, Suwon-si (KR); Won Kyu Park, Suwon-si (KR); Jin Park, Suwon-si (KR); Kyeong Jae Lee, Suwon-si (KR); Byeong Kyu Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 327 days.

(21) Appl. No.: 17/667,309

(22) Filed: Feb. 8, 2022

(65) Prior Publication Data
US 2022/0159855 A1 May 19, 2022

Related U.S. Application Data

(63) Continuation of application No. PCT/KR2019/015114, filed on Nov. 8, 2019.

(30) Foreign Application Priority Data

Aug. 9, 2019 (KR) .................. 10-2019-0097589

(51) Int. Cl.
*H05K 5/02* (2006.01)
*G06F 1/16* (2006.01)

(52) U.S. Cl.
CPC ......... *H05K 5/0221* (2013.01); *G06F 1/1607* (2013.01); *H05K 5/0247* (2013.01); *G06F 2200/1639* (2013.01)

(58) Field of Classification Search
CPC .......... G06F 1/1601; G06F 2200/1639; G06F 2200/1612; H05K 5/0221; H05K 5/0017;
(Continued)

(56) References Cited

U.S. PATENT DOCUMENTS

| | | | |
|---|---|---|---|
| 3,345,706 A | 10/1967 | Stokes et al. | |
| 7,088,577 B2 * | 8/2006 | Lauffer | H02G 11/00 361/679.21 |

(Continued)

FOREIGN PATENT DOCUMENTS

| | | |
|---|---|---|
| CN | 200956632 Y | 10/2007 |
| DE | 2 300 731 A1 | 7/1973 |

(Continued)

OTHER PUBLICATIONS

Google Translation of CN 200956632 (Year: 2024).*

(Continued)

*Primary Examiner* — Sagar Shrestha
(74) *Attorney, Agent, or Firm* — STAAS & HALSEY LLP

(57) ABSTRACT

A display apparatus including display panel, a rear case to cover a rear of the display panel and the rear case including a cable fixing hole to which a cable is fixed, a connector connected to the cable and fastened to the rear case so that the cable is connected to the rear case, a cable holder to surround a part of the cable and fixed to the cable fixing hole so that the cable is fixed to the rear case, and a clamp to fix the cable holder to the cable fixing hole, wherein the clamp includes a first hook to be fixed to the cable fixing hole, and a second hook having a different shape than a shape of the first hook and to be fixed to the cable fixing hole to have a greater fixing force than a fixing force of the first hook.

15 Claims, 9 Drawing Sheets

(58) Field of Classification Search
CPC ........ H05K 5/0247; H05K 5/03; H01R 13/73;
H01R 24/20; H01R 2201/18; H01R
13/639; H02G 3/32; H04N 5/64
See application file for complete search history.

(56) References Cited

U.S. PATENT DOCUMENTS

| | | | | |
|---|---|---|---|---|
| 7,097,047 | B2* | 8/2006 | Lee | H05K 7/1491 361/825 |
| 7,201,352 | B2* | 4/2007 | Kawai | F16L 3/1075 248/68.1 |
| 8,897,003 | B2* | 11/2014 | Ishii | G06F 1/181 439/497 |
| 9,000,299 | B2 | 4/2015 | Ruth | |
| 9,241,419 | B2 | 1/2016 | Ikezawa | |
| 9,915,281 | B2 | 3/2018 | Weatherl | |
| 10,051,760 | B2* | 8/2018 | Miyatsu | G06F 1/181 |
| 10,106,303 | B2 | 10/2018 | Drane et al. | |
| 10,207,460 | B2* | 2/2019 | Reznar | B29C 35/0805 |
| 10,291,803 | B2* | 5/2019 | Sawada | H04N 1/00564 |
| 10,955,873 | B1* | 3/2021 | Godfrey | H05K 5/0234 |
| 2004/0047115 | A1* | 3/2004 | Helot | F16M 11/2021 361/679.06 |
| 2004/0238199 | A1* | 12/2004 | Yamanaka | G03G 15/605 174/68.1 |
| 2005/0141180 | A1* | 6/2005 | Umeda | H02G 11/00 345/905 |
| 2005/0272297 | A1 | 12/2005 | Lee et al. | |
| 2006/0016937 | A1* | 1/2006 | Plate | F16L 3/06 248/58 |
| 2006/0021789 | A1* | 2/2006 | Nishikino | G03G 15/80 439/577 |
| 2007/0018057 | A1* | 1/2007 | Kovac | F16L 3/237 248/68.1 |
| 2009/0149055 | A1* | 6/2009 | Uchikawa | H01R 13/6395 439/367 |
| 2011/0116218 | A1* | 5/2011 | Choi | G06F 1/1605 361/679.01 |
| 2012/0267487 | A1* | 10/2012 | Takamatsu | H04N 5/64 248/158 |
| 2013/0194736 | A1* | 8/2013 | Ishii | G06F 1/18 361/679.02 |
| 2013/0284238 | A1* | 10/2013 | Park | H02S 40/34 136/251 |
| 2013/0284513 | A1* | 10/2013 | Oh | H02G 3/00 174/520 |
| 2017/0127554 | A1* | 5/2017 | Iizuka | H05K 7/1491 |
| 2018/0187798 | A1* | 7/2018 | Kanie | F16L 3/13 |
| 2019/0017658 | A1 | 1/2019 | King | |
| 2019/0056058 | A1* | 2/2019 | Pell | F16M 11/04 |
| 2019/0075945 | A1 | 3/2019 | Strassburger et al. | |
| 2019/0089073 | A1 | 3/2019 | Mori | |
| 2022/0360059 | A1* | 11/2022 | Michael | H01B 7/0045 |

FOREIGN PATENT DOCUMENTS

| | | |
|---|---|---|
| FR | 2 259 273 | 8/1975 |
| GB | 2 090 907 A | 7/1982 |
| JP | 08294216 A | 11/1996 |
| JP | 2001-7564 A | 1/2001 |
| JP | 4044705 B2 | 2/2008 |
| JP | 4289495 B2 | 7/2009 |
| JP | 2017-32017 A | 2/2017 |
| KR | 10-2006-002175 A | 3/2006 |
| KR | 10-2009-0076243 A | 7/2009 |
| KR | 10-1488999 B1 | 2/2015 |

OTHER PUBLICATIONS

European Search Report dated Jul. 27, 2022 issue in European Application No. 19 94 1466.

QLED Q90R user manual. Samsung Electronics Co., Ltd. Jul. 11, 2019 <URL: https://www/samsung.com/ru/support/model/QE55Q90RAUXRU/> english—6, 7.

International Search Report issued in PCT/KR2019/015114 dated May 7, 2020.

* cited by examiner

DISPLAY APPARATUS

CROSS-REFERENCE TO RELATED APPLICATION(S)

This application is a continuation application, under 35 U.S.C. § 111(a), of international application No. PCT/KR2019/015114, filed on Nov. 8, 2019, which claims priority to Korean Patent Applications No. 10-2019-0097589, filed on Aug. 9, 2019 in the Korean Intellectual Property Office, the disclosure of which is incorporated by reference herein in its entireties.

FIELD

The present disclosure relates to a display apparatus capable of fixing a cable so as not to be lifted.

DESCRIPTION OF RELATED ART

Generally, a display apparatus is an apparatus that displays an image, such as a monitor and a television.

A display apparatus includes a display panel for optically displaying an image, and a rear cover for covering a rear surface of the display panel.

A cable for transmitting image or supplying power is connected to the rear case. The cable is connected to a connector, and as the connector is fastened to the rear case, the cable may be connected to the rear case.

When the cable is not fixed to the rear case, the connector may be broken as the cable is pulled toward the rear of the rear case. In order to prevent this, the cable needs to be fixed to the rear case.

In order to fix the cable to the rear case, the cable is provided with a cable holder to surround a portion of the cable, and the cable holder is fixed to the rear case by a fastening member such as a screw so that the cable may be fixed to the rear case.

In order to fix the cable to the rear case by means of a fastening member such as a screw, an instrument for assembling or disassembling the fastening member such as a screw is required. In addition, because a consumer has to directly assemble or disassemble the fastening member such as a screw using an instrument, the convenience of the consumer may be reduced, and an occurrence rate of defects or service calls may increase.

SUMMARY

The present disclosure is directed to providing a display apparatus capable of allowing a cable to be easily fixed to a rear case without a separate instrument.

An aspect of the present disclosure provides a display apparatus including a display panel, a rear case provided to cover a rear of the display panel and the rear case including a cable fixing hole to which a cable is fixed, a connector connected to the cable and fastened to the rear case so that the cable is connected to the rear case, a cable holder to surround a part of the cable and fixed to the cable fixing hole so that the cable is fixed to the rear case, and a clamp to fix the cable holder to the cable fixing hole, wherein the clamp includes a first hook provided to be fixed to the cable fixing hole, and a second hook having a different shape than a shape of the first hook and to be fixed to the cable fixing hole to have a greater fixing force than a fixing force of the first hook.

The clamp may further include a pair of fixing pins to be inserted into and fixed to the cable fixing hole, a pressing part to which a force is applied to insert the pair of fixing pins into the cable fixing hole, and a handle to which a force is applied to separate the pair of fixing pins from the cable fixing hole, and the pair of fixing pins comprises the first hook and the second hook respectively provided at ends.

The cable holder may include a passing hole at a position corresponding to the cable fixing hole and through which the pair of fixing pins pass.

The pair of fixing pins may be elastically deformable.

The first hook may include a first protruding portion protruded in a radial direction of the cable fixing hole and fixed to the cable fixing hole.

The second hook may include a second protruding portion protruded in the radial direction of the cable fixing hole and fixed to the cable fixing hole, and a concave portion depressed in the radial direction of the cable fixing hole on an opposite surface of the second protruding portion.

The second protruding portion may be protruded more than the first protruding portion.

The pair of fixing pins may have outer diameters equal to or smaller than inner diameters of the passing hole and the cable fixing hole so as to be inserted into the passing hole and the cable fixing hole.

The first hook and the second hook may be protruded to have outer diameters larger than the inner diameter of the cable fixing hole, and may be elastically deformed when the pair of fixing pins are inserted into the cable fixing hole.

The pressing part may be on the pair of fixing pins, and when the pair of fixing pins are inserted into the cable fixing hole, a force may be applied to an upper end of the pressing part in a direction in which the pair of fixing pins are inserted into the cable fixing hole.

When a force is applied to the pressing part in a state in which the pair of fixing pins are positioned above the passing hole and the cable fixing hole, the first hook and the second hook may be elastically deformed to be inserted into the passing hole and the cable fixing hole, and the first hook and the second hook that have passed through the cable fixing hole may be elastically deformed to original states thereof to be fixed to the cable fixing hole.

The handle may be to extend from one side of the pressing part adjacent to the first hook in the first hook and the second hook.

When the pair of fixing pins are separated from the cable fixing hole, a force may be applied to a lower end of the handle in a direction in which the pair of fixing pins are separated from the cable fixing hole.

When a force is applied to the handle in a state in which the first hook and the second hook are fixed to the cable fixing hole, the first hook may be elastically deformed so that the first protruding portion protruding less than the second protruding portion is released from the cable fixing hole.

When the first hook is released from the cable fixing hole by being elastically deformed, the second hook may be elastically deformed so that the concave portion receives an opposite surface of the first protruding portion of the first hook, whereby the second protruding portion may be released from the cable fixing hole so that the clamp is separated from the cable fixing hole.

According to embodiments of the present disclosure, by allowing a cable to be easily fixed to a rear case without a separate instrument, the convenience of a consumer can be increased, and an occurrence rate of service calls can be reduced.

In addition, damage to a connector can be prevented.

DETAILED DESCRIPTION

Figure 1:
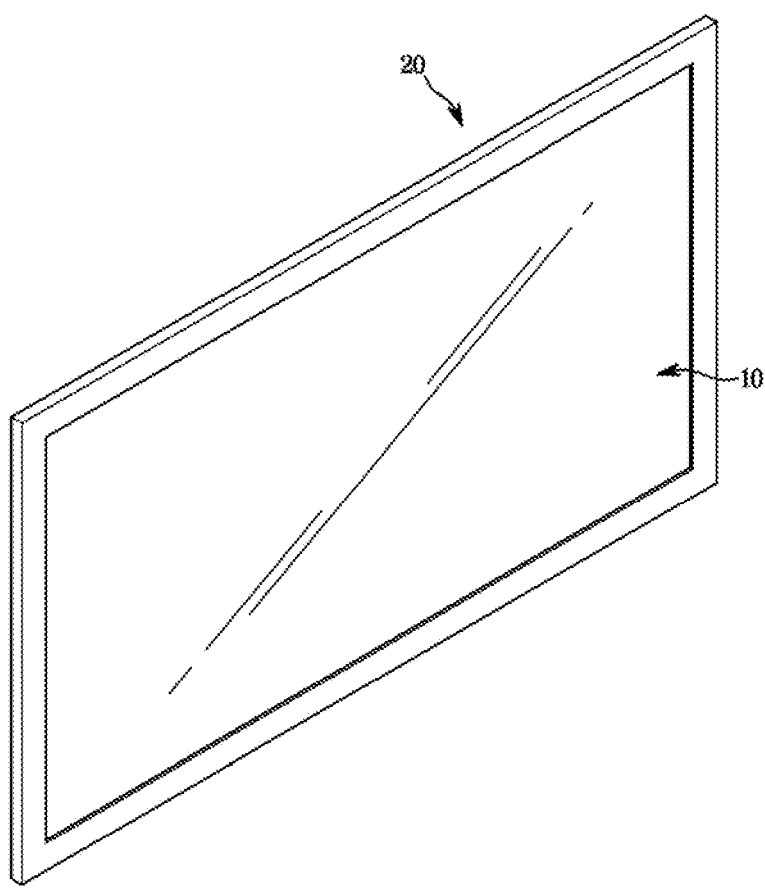
FIG. 1 is a perspective view schematically illustrating a front surface of a display apparatus according to an embodiment of the present disclosure.

The embodiments described in the present specification and the configurations shown in the drawings are only examples of preferred embodiments of the present disclosure, and various modifications may be made at the time of filing of the present disclosure to replace the embodiments and drawings of the present specification.

Like reference numbers or signs in the various drawings of the application represent parts or components that perform substantially the same functions.

The terms used herein are for the purpose of describing the embodiments and are not intended to restrict and/or to limit the present disclosure. For example, the singular expressions herein may include plural expressions, unless the context clearly dictates otherwise. Also, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms first, second, etc. may be used herein to describe various components, these components should not be limited by these terms. These terms are only used to distinguish one component from another. For example, without departing from the scope of the present disclosure, the first component may be referred to as a second component, and similarly, the second component may also be referred to as a first component. The term "and/or" includes any combination of a plurality of related items or any one of a plurality of related items.

In this specification, the terms "front surface," "rear surface," "front end," "rear end," "upper portion," "lower portion," "upper end" and "lower end" used in the following description are defined with reference to the drawings, and the shape and position of each component are not limited by these terms.

Hereinafter, embodiments of the present disclosure will be described in detail with reference to the accompanying drawings.

Figure 2:
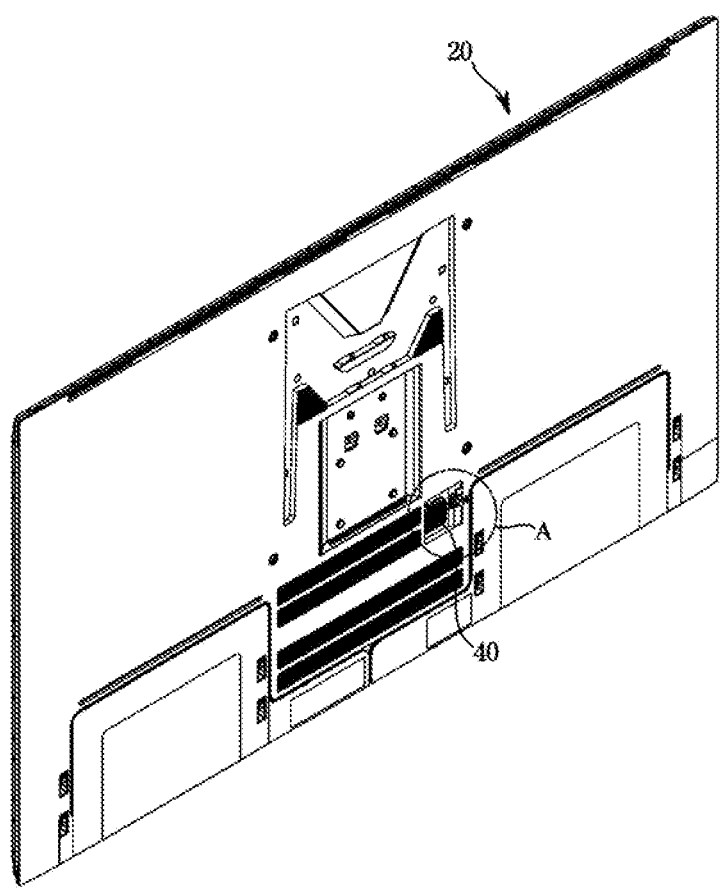
FIG. 2 is a perspective view illustrating a rear case of the display apparatus according to an embodiment of the present disclosure

FIG. 1 is a perspective view schematically illustrating a front surface of a display apparatus according to an embodiment of the present disclosure, and FIG. 2 is a perspective view illustrating a rear case of the display apparatus according to an embodiment of the present disclosure As illustrated in FIGS. 1 and 2, a display apparatus may include a display panel 10 provided to display an image, and a rear case 20 provided to cover a rear surface of the display panel 10.

Although not shown in the drawings, the display apparatus may include a light source module provided between the display panel 10 and the rear case 20 to irradiate light, a light guide plate provided to guide light emitted from the light source module to the display panel 10, an optical sheet disposed between the display panel 10 and the light guide plate to improve optical characteristics of light guided to the display panel 20 by the light guide plate, a reflective sheet disposed behind the light guide plate to reflect light emitted through a rear surface of the light guide plate to the front, and the like.

The rear case 20 may be disposed at the rear of the display panel 10 to cover the rear surface of the display panel 10. The rear case 20 may include a connector fastening portion 21 (see FIG. 3) and a cable fixing hole 23 (see FIG. 3). A connector 40 to which a cable 30 (see FIG. 3) is connected may be fastened to the connector fastening portion 21. As the connector 40 is fastened to the connector fastening portion 21, the cable 30 may be connected to the rear case 20. A clamp 100 (see FIG. 3), which will be described later, may be inserted into and fixed to the cable fixing hole 23. A configuration in which the clamp 100 is fixed to the cable fixing hole 23 will be described later.

Figure 3:
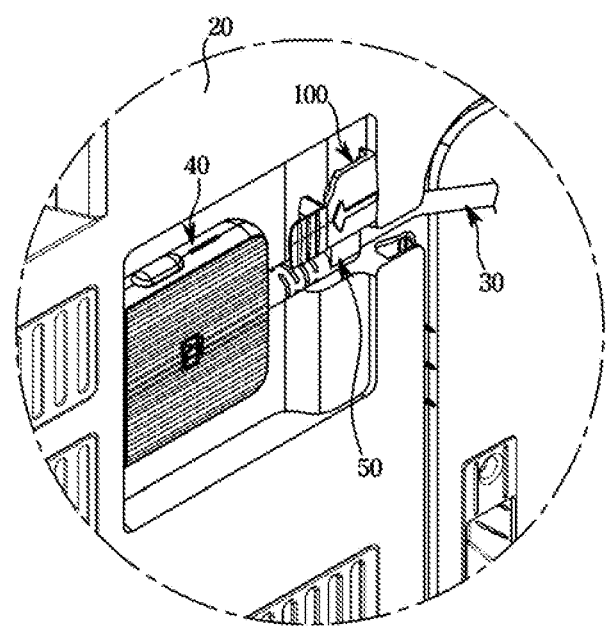
FIG. 3 is an enlarged view of part A in FIG. 2.
Figure 4:
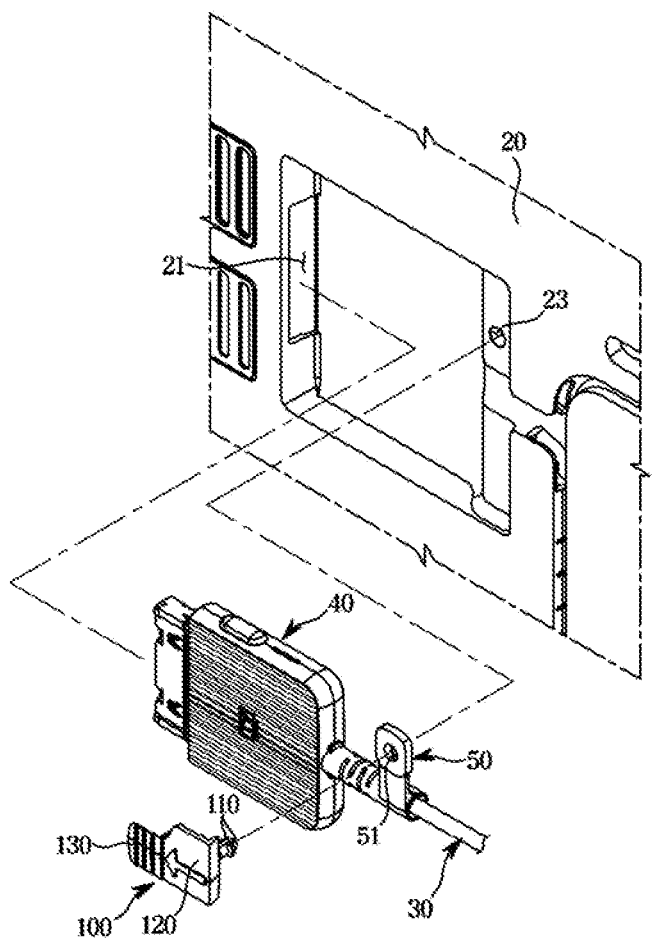
FIG. 4 is a view illustrating a state in which a connector and a clamp are separated from the rear case according to an embodiment of the present disclosure.
Figure 5:
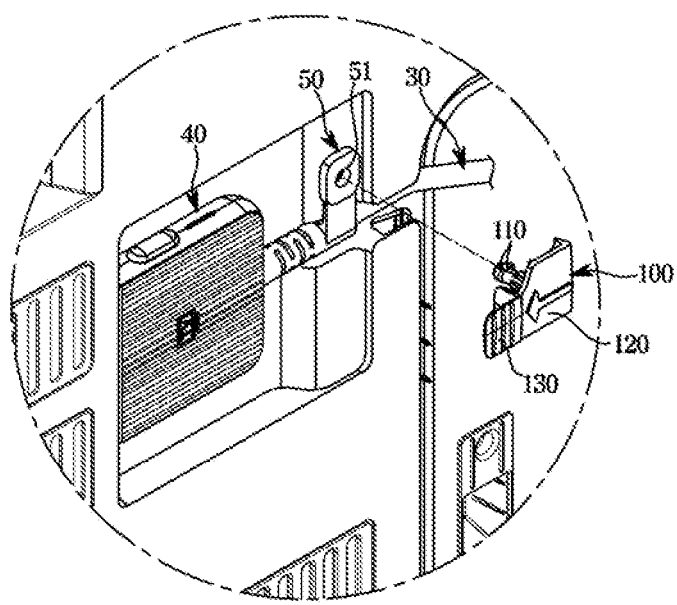
FIG. 5 is a view illustrating that the clamp is fitted to a cable holder in order to fix the cable to the rear case according to an embodiment of the present disclosure.

FIG. 3 is an enlarged view of part A in FIG. 2, FIG. 4 is a view illustrating a state in which a connector and a clamp are separated from the rear case according to an embodiment of the present disclosure, and FIG. 5 is a view illustrating that the clamp is fitted to a cable holder in order to fix the cable to the rear case according to an embodiment of the present disclosure.

As illustrated in FIGS. 3 to 5, the rear case 20 may include the connector fastening portion 21 to which the connector 40 is fastened, and the cable fixing hole 23 into and to which a clamp 100 for fixing the cable 30 is inserted and fixed.

A cable holder 50 may be provided on the connector 40 to fix the cable 30 connected to the connector 40. The cable holder 50 may be provided to surround a portion of the cable 30. The cable holder 50 may include a passing hole 51 through which the clamp 100 passes to fix the cable holder 50 to the rear case 20. The passing hole 51 may be provided at a position corresponding to the cable fixing hole 23 of the rear case 20. The cable holder 50 may be provided integrally with the connector 40. Although not shown in the drawings, the cable holder 50 may be provided separately from the connector 40.

The clamp 100 may be fixed to the cable fixing hole 23 by being inserted into the passing hole 51 of the cable holder 50 and the cable fixing hole 23 of the rear case 20.

The clamp 100 may include a pair of fixing pins 110 inserted into and fixed to the cable fixing hole 23, a pressing part 120 to which a force is applied to insert the pair of fixing pins 110 into the cable fixing hole 23, and a handle 130 to which a force is applied to separate the pair of fixing pins 110 from the cable fixing hole 23.

Figure 6:
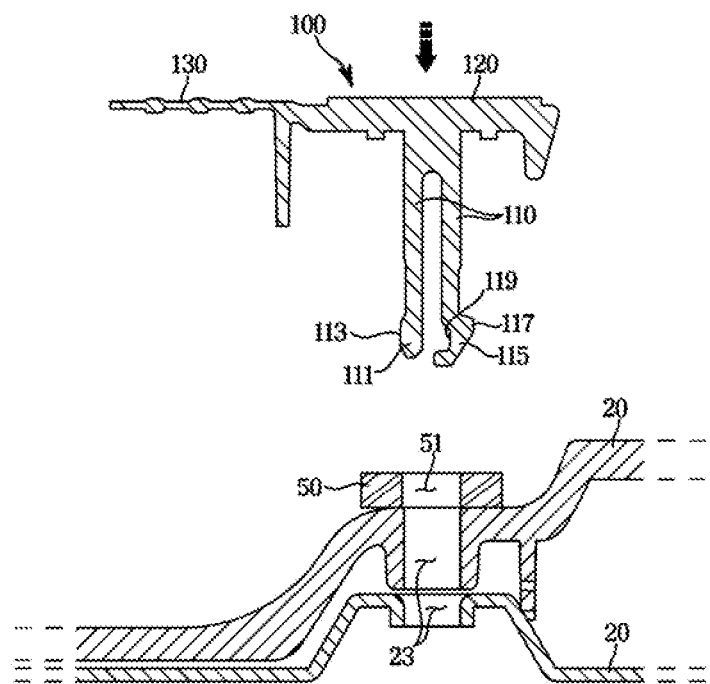
FIG. 6 is a cross-sectional view illustrating that a force is applied to a pressing part in order to insert the clamp into a passing hole of the cable holder and a cable fixing hole of the rear case according to an embodiment of the present disclosure.
Figure 7:
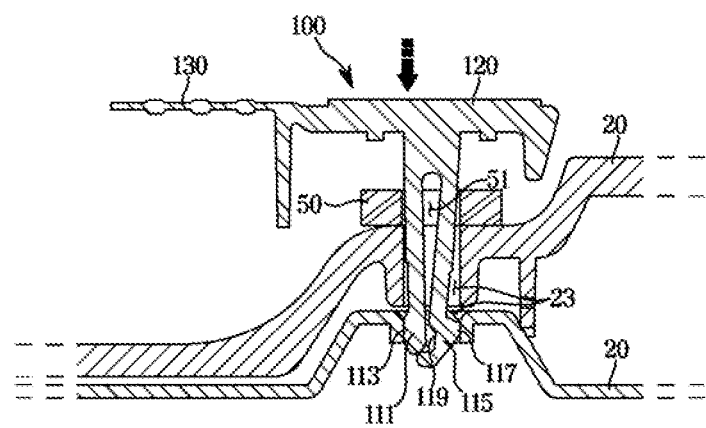
FIG. 7 is a cross-sectional view illustrating a state in which a pair of fixing pins are elastically deformed by the clamp being inserted into the passing hole of the cable holder and the cable fixing hole of the rear case according to an embodiment of the present disclosure.
Figure 8:
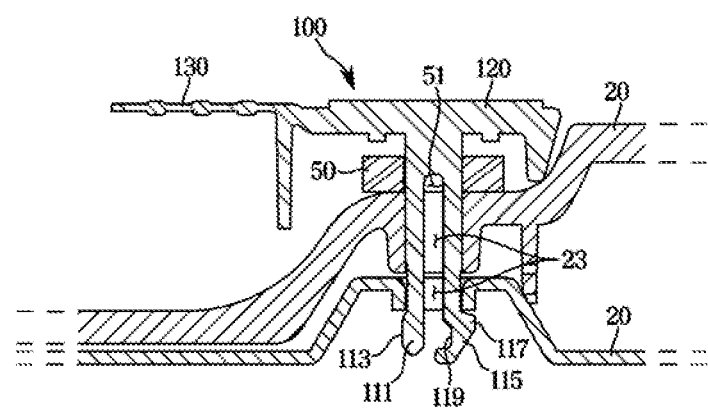
FIG. 8 is a cross-sectional view illustrating a state in which a first hook and a second hook are fixed to the cable fixing hole according to an embodiment of the present disclosure.
Figure 9:
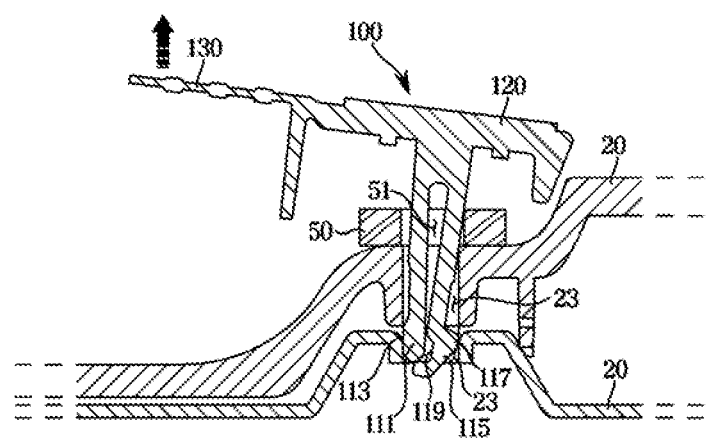
FIG. 9 is a cross-sectional view illustrating a state in which a force is applied to a handle in order to remove the clamp from the cable fixing hole according to an embodiment of the present disclosure.

FIG. 6 is a cross-sectional view illustrating that a force is applied to a pressing part in order to insert the clamp into a passing hole of the cable holder and a cable fixing hole of the rear case according to an embodiment of the present disclosure, FIG. 7 is a cross-sectional view illustrating a state in which a pair of fixing pins are elastically deformed by the clamp being inserted into the passing hole of the cable holder and the cable fixing hole of the rear case according to an embodiment of the present disclosure, FIG. 8 is a cross-sectional view illustrating a state in which a first hook and a second hook are fixed to the cable fixing hole according to an embodiment of the present disclosure, and FIG. 9 is a cross-sectional view illustrating a state in which a force is applied to a handle in order to remove the clamp from the cable fixing hole according to an embodiment of the present disclosure.

As illustrated in FIG. 6, the clamp 100 may include the pair of fixing pins 110 inserted into and fixed to the cable fixing hole 23, the pressing part 120 to which a force is applied to insert the pair of fixing pins 110 into the cable fixing hole 23, and the handle 130 to which a force is applied to separate the pair of fixing pins 110 from the cable fixing hole 23.

The pair of fixing pins 110 may be provided to be elastically deformable. The pair of fixing pins 110 may include a first hook 111 provided at an end of one of the pair of fixing pins 110, and a second hook 115 provided at an end of the other one of the pair of fixing pins 110.

The first hook 111 may include a first protruding portion 113 provided to protrude in a radial direction of the cable fixing hole 23. The first protruding portion 113 may be fixed to the cable fixing hole 23 when the pair of fixing pins 110 are inserted into the cable fixing hole 23.

The second hook 115 may include a second protruding portion 117 provided to protrude in the radial direction of the cable fixing hole 23, and a concave portion 119 provided to be depressed in the radial direction of the cable fixing hole 23 on an opposite surface of the second protruding portion 117. The second protruding portion 117 may be fixed to the cable fixing hole 23 when the pair of fixing pins 110 are inserted into the cable fixing hole 23.

In comparing the first protruding portion 113 of the first hook 111 and the second protruding portion 117 of the second hook 115, the second protruding portion 117 may be provided to protrude further in the radial direction of the cable fixing hole 23 than the first protruding portion 113. By protruding the second protruding portion 117 more than the first protruding portion 113, when the first hook 111 and the second hook 115 are fixed to the cable fixing hole 23, a fixing force of the second hook 115 fixed to the cable fixing hole 23 by the second protruding portion 117 may be greater than that of the first hook 111. The fixing force may refer to a force required to release the first hook 111 and the second hook 115 from the cable fixing hole 23 when the first hook 111 and the second hook 115 are fixed to the cable fixing hole 23.

Because the first protruding portion 113 of the first hook 111 protrudes relatively smaller than the second protruding portion 117 of the second hook 115, when the pair of fixing pins 110 are inserted into and fixed to the cable fixing hole 23, the pair of fixing pins 110 may be easily inserted and fixed.

The pair of fixing pins 110 may be provided to have an outer diameter equal to or smaller than inner diameters of the passing hole 51 and the cable fixing hole 23 to be easily inserted into the passing hole 51 of the cable holder 50 and the cable fixing hole 23 of the rear case 20. The inner diameter of the passing hole 51 may be larger than or equal to the inner diameter of the cable fixing hole 23.

The first hook 111 and the second hook 115 may protrude to have an outer diameter larger than the inner diameter of the cable fixing hole 23 so that the pair of fixing pins 110 may be fixed to the cable fixing hole 23 by being inserted into the passing hole 51 and the cable fixing hole 23. That is, the first protruding portion 113 and the second protruding portion 117 may protrude to have outer diameters larger than the inner diameter of the cable fixing hole 23.

Because the first protruding portion 113 and the second protruding portion 117 may protrude to have the outer diameters larger than the inner diameter of the cable fixing hole 23, when the pair of fixing pins 110 is inserted into the cable fixing hole 23, the pair of fixing pins 110 may be elastically deformed so that the outer diameters of the first hook 111 and the second hook 115 decrease. After the first hook 111 and the second hook 115 are fully inserted and pass through the cable fixing hole 23, the first hook 111 and the second hook 115 may be elastically deformed to return to the original outer diameter. When the first hook 111 and the second hook 115 are elastically deformed to return to the original outer diameters, the first protruding portion 113 and the second protruding portion 117 may be fixed to the cable fixing hole 23.

The pressing part 120 may be provided above the pair of fixing pins 110. When the pair of fixing pins 110 are inserted into the cable fixing hole 23, a force is applied to an upper end of the pressing part 120 in a direction in which the pair of fixing pins 110 are inserted into the cable fixing hole 23.

The handle 130 may be provided to extend from one side of the pressing part 120 adjacent to the first hook 111 in the first hook 111 and the second hook 115. When the pair of fixing pins 110 are separated from the cable fixing hole 23, a force is applied to a lower end of the handle 130 in a direction in which the pair of fixing pins 110 are separated from the cable fixing hole 23. The reason that the handle 130 extends from one side of the pressing part 120 adjacent to the first hook 111 is that the first hook 111 may be released from the cable fixing hole 23 with a smaller force than the second hook 115. In addition, this is to cause more elastic deformation to occur in the second hook 115 than in the first hook 111 in order to easily release the second hook 115 which requires a great force to be released from the cable fixing hole 23.

Hereinafter, an operation of fixing or releasing the cable 30 by the clamp 100 will be described in detail.

As illustrated in FIG. 6, in order to fix the cable 30 to the rear case 20, first, the clamp 100 may be positioned above the passing hole 51 and the case fixing hole 23. In a state in which the clamp 100 is positioned above the passing hole 51 and the case fixing hole 23, a user may press the upper end of the pressing part 120.

When a force is applied to the upper end of the pressing part 120 by pressing the upper end of the pressing part 120 in the direction in which the pair of fixing pins 110 are inserted into the cable fixing hole 23, as illustrated in FIG. 7, the first hook 111 and the second hook 115 may be inserted into the passing hole 51 and the cable fixing hole 23 by being elastically deformed so that the outer diameters thereof decrease. When the first hook 111 and the second hook 115 are inserted into the passing hole 51 and the cable fixing hole 23, the first protruding portion 113 and the second protruding portion 117 may come into contact with inner walls of the passing hole 51 and the cable fixing hole 23. In this case, the force applied to the pressing part 120 may be substantially 1 kgf.

When the force is continuously applied to the pressing part 120, as illustrated in FIG. 8, the first hook 111 and the second hook 115 may pass through the cable fixing hole 23. When the first hook 111 and the second hook 115 pass through the cable fixing hole 23, the first protruding portion 113 and the second protruding portion 117 may not be in contact with the inner walls of the passing hole 51 and the cable fixing hole 23. When the first protruding portion 113 and the second protruding portion 117 are not in contact with the inner walls of the passing hole 51 and the cable fixing hole 23, the first hook 111 and the second hook 115 may be elastically deformed so that the outer diameters thereof increase as much as the original outer diameters. When the first hook 111 and the second hook 115 are elastically deformed so that the outer diameters thereof increase, the first protruding portion 113 and the second protruding portion 117 may be fixed to the cable fixing hole 23. At this time, because the second protruding portion 117 protrudes relatively more than the first protruding portion 113, the fixing force of the clamp 100 may increase. In this case, the fixing force may be substantially 13 kgf. As the fixing force of the clamp 100 increases, even when the cable 30 is pulled, the clamp 100 may not be easily separated. Accordingly, the cable 30 may be maintained in a state of being fixed to the rear case 20.

In order to separate the clamp 100 from the cable fixing hole 23, as illustrated in FIG. 9, the user may raise the handle 130. When the user raises the handle 130, a force may be applied to the lower end of the handle 130 in the direction in which the pair of fixing pins 110 are separated from the cable fixing hole 23. When a force is applied to the handle 130, as the first hook 111 adjacent to the handle 130 is elastically deformed, the first protruding portion 113 may be easily released from the cable fixing hole 23.

When the first hook 111 is released from the cable fixing hole 23 by being elastically deformed, the second hook 115 may be elastically deformed so that the concave portion 119 may move to a position for receiving an opposite surface of the first protruding portion 113 of the first hook 111. When the second hook 115 is elastically deformed, the second protruding portion 117 may be released from the cable fixing hole 23.

As described above, when the first hook 111 and the second hook 115 are released from the cable fixing hole 23 as the first hook 111 and the second hook 115 are elastically deformed so that the outer diameters thereof decrease, the clamp 100 may be separated from the cable fixing hole 23 as illustrated in FIG. 6. At this time, the force applied to the handle 130 may be substantially 1 kgf.

While the present disclosure has been particularly described with reference to exemplary embodiments, it should be understood by those of skill in the art that various changes in form and details may be made without departing from the spirit and scope of the present disclosure.

What is claimed is:
1. A display apparatus comprising:
  a display panel;
  a rear case to cover a rear of the display panel, the rear case comprising a cable fixing hole;
  a connector connected to a cable and fastened to the rear case so that the cable is connected to the rear case;
  a cable holder to surround a part of the cable and fixed to the cable fixing hole so that the cable is fixed to the rear case; and
  a clamp to fix the cable holder to the cable fixing hole, wherein the clamp comprises:
    a pressing part;
    a pair of fixing pins extended from the pressing part and to be inserted into to the cable fixing hole thereby fixing the cable holder to the rear case, the pair of fixing pins comprising:
      a first hook formed at an end of a first fixing pin of the pair of fixing pins to be fixed to the cable fixing hole; and
      a second hook formed at an end of a second fixing pin of the pair of fixing pins, the second hook comprising a concave portion depressed in a direction away from the first hook, having a different shape than a shape of the first hook, and having a greater fixing force than a fixing force of the first hook,
  wherein in response to applying the force to the pressing part to insert the pair of fixing pins into the cable fixing hole, the second hook is deformed to receive a portion of the first hook in the concave portion so that the pair of pins is allowed to pass through the cable fixing hole.

2. The display apparatus according to claim 1, wherein the clamp further comprises a handle extended from the pressing part, and in response to applying a force to the handle to release the pair of fixing pins from the cable fixing hole, the second hook is deformed to receive the portion of the first hook in the concave portion so that the pair of pins is allowed to pass through the cable fixing hole.

3. The display apparatus according to claim 2, wherein the cable holder comprises a passing hole at a position corresponding to the cable fixing hole so that the pair of fixing pins pass through the passing hole and the cable fixing hole to fix the cable holder to the rear case.

4. The display apparatus according to claim 3, wherein the pair of fixing pins are elastically deformable.

5. The display apparatus according to claim 4, wherein the first hook comprises a first protruding portion protruded in a direction away from the second hook, deformed to pass through the cable fixing hole, and fixed to the rear case.

6. The display apparatus according to claim 5, wherein the second hook comprises:
  a second protruding portion protruded in the direction of away from the first hook, deformed to pass through the cable fixing hole, and fixed to the rear case.

7. The display apparatus according to claim 6, wherein the second protruding portion is protruded more than the first protruding portion.

8. The display apparatus according to claim 7, wherein the pair of fixing pins have outer diameters equal to or smaller than inner diameters of the passing hole and the cable fixing hole so as to be inserted into the passing hole and the cable fixing hole.

9. The display apparatus according to claim 8, wherein the first hook and the second hook are protruded to have outer diameters larger than the inner diameter of the cable fixing hole, and are elastically deformed when the pair of fixing pins are inserted into the cable fixing hole.

10. The display apparatus according to claim 9, wherein the pressing part is on the pair of fixing pins, and in response to inserting the pair of fixing pins into the cable fixing hole, a force is applied to an upper end of the pressing part in a direction in which the pair of fixing pins are inserted into the cable fixing hole.

11. The display apparatus according to claim 10, wherein in response to applying a force to the pressing part in a state in which the pair of fixing pins are positioned above the passing hole and the cable fixing hole, the first hook and the second hook are elastically deformed to be inserted into the passing hole and the cable fixing hole, and the first hook and the second hook that have passed through the cable fixing hole are elastically deformed to original states thereof to be fixed to the cable fixing hole.

12. The display apparatus according to claim 11, wherein the handle is extended from one side of the pressing part adjacent to the first hook.

13. The display apparatus according to claim 12, wherein in response to separating the pair of fixing pins from the cable fixing hole, a force is applied to a lower end of the handle in a direction in which the pair of fixing pins are separated from the cable fixing hole.

14. The display apparatus according to claim 13, wherein in response to applying a force to the handle in a state in which the first hook and the second hook are fixed to the cable fixing hole, the first hook is elastically deformed so that the first protruding portion protruding less than the second protruding portion is released from the cable fixing hole.

15. The display apparatus according to claim 14, wherein in response to releasing the first hook from the cable fixing hole by being elastically deformed, the second hook is elastically deformed so that the concave portion receives an opposite surface of the first protruding portion of the first hook, whereby the second protruding portion is released from the cable fixing hole so that the clamp is separated from the cable fixing hole.

* * * * *